United States Patent
Wallace, Jr. et al.

(10) Patent No.: US 6,200,383 B1
(45) Date of Patent: Mar. 13, 2001

(54) MELT DEPTH CONTROL FOR SEMICONDUCTOR MATERIALS GROWN FROM A MELT

(75) Inventors: Richard L. Wallace, Jr., Acton; Richard C. Krauchune, Shirley, both of MA (US)

(73) Assignee: Evergreen Solar, Inc., Waltham, MA (US)

( * ) Notice: Subject to any disclaimer, the term of this patent is extended or adjusted under 35 U.S.C. 154(b) by 0 days.

(21) Appl. No.: 09/304,499

(22) Filed: May 3, 1999

(51) Int. Cl.[7] .................................................. C30B 15/20
(52) U.S. Cl. ................................ 117/16; 117/14; 117/15; 117/29; 117/201; 117/202; 117/211; 117/214
(58) Field of Search ................................ 117/14, 15, 16, 117/29, 201, 202, 214, 211

(56) References Cited

U.S. PATENT DOCUMENTS

| | | |
|---|---|---|
| 3,980,438 | 9/1976 | Castonguay et al. . |
| 4,036,595 | 7/1977 | Lorenzini et al. . |
| 4,469,552 | 9/1984 | Thornhill . |
| 4,512,954 | 4/1985 | Matsui . |
| 4,577,588 | 3/1986 | Mautref et al. . |
| 4,594,229 | 6/1986 | Ciszek et al. . |
| 4,626,847 | * 12/1986 | Nakajima ........................ 117/15 |
| 4,627,887 | 12/1986 | Sachs . |
| 4,661,200 | 4/1987 | Sachs . |
| 4,689,109 | 8/1987 | Sachs . |
| 4,936,947 | 6/1990 | Mackintosh . |
| 5,098,229 | 3/1992 | Meier et al. . |
| 5,242,667 | 9/1993 | Koziol et al. . |
| 5,690,732 | * 11/1997 | Otani et al. ..................... 117/15 |
| 5,723,337 | * 3/1998 | Muller et al. .................... 117/15 |
| 5,911,826 | * 6/1999 | Hirashi et al. ................... 117/14 |

FOREIGN PATENT DOCUMENTS

| | | |
|---|---|---|
| 0 170 856 | 2/1986 | (EP) . |
| 2556109 | 6/1985 | (FR) . |
| 53-073481 | 6/1978 | (JP) . |
| 59-182293 | 10/1984 | (JP) . |

* cited by examiner

Primary Examiner—Robert Kunemund
(74) Attorney, Agent, or Firm—Testa, Hurwitz & Thibeault, LLP

(57) ABSTRACT

The invention features a method of controlling the depth of a melt for or crystal growth. According to the method, an input signal is applied through a crucible and a material disposed within the crucible. An output signal generated in response to the input signal is measured. The output signal relates to the depth of the melt. An amount of the source material introduced into the melt is adjusted to maintain the depth of the melt at a substantially constant level using the output signal.

21 Claims, 4 Drawing Sheets

MELT DEPTH CONTROL FOR SEMICONDUCTOR MATERIALS GROWN FROM A MELT

FIELD OF THE INVENTION

The invention relates generally to crystal growth of semiconductor materials, and more specifically to continuous crystal growth of silicon sheet for use as solar cell substrate material.

BACKGROUND

To produce lower cost solar cells to facilitate large scale electrical applications of solar electricity, it is important to provide lower cost substrate materials for making the solar cells. A known method for achieving this objective is to grow a crystalline silicon using a continuous ribbon growth process as described in U.S. Pat. Nos. 4,661,200; 4,627,887; 4,689,109; and 4,594,229.

According to the continuous ribbon growth method, two high temperature material strings are introduced through holes in a crucible which contains a shallow layer of molten silicon. A crystalline silicon ribbon forms as the melt solidifies while being pulled vertically from the melt. The strings stabilize the position of edges of the growing ribbon. The molten silicon freezes into a solid ribbon just above the layer of molten silicon. To make this ribbon silicon process continuous, more silicon is added to the melt as the crystalline silicon is formed to keep the amount of melt constant. Keeping the amount of the melt constant during the growth process is important in order to achieve uniform and controllable growth of the crystalline silicon. It is also important to keep the thermal environment of the cooling ribbon constant. Slight changes in the depth of the melt and consequent changes in the vertical position of the solid-liquid interface can significantly change this thermal environment. For example, it has been found that variations in the melt depth of more than about one millimeter can result in a markedly different thickness and introduce a residual stress state of the grown silicon ribbon. For all of these reasons, a constant melt level is an important element in insuring uniform, controlled growth of silicon ribbon.

One way to control the depth of the melt is to continuously measure the depth of the melt and to control the rate at which silicon is added to the melt based on the measured depth. The depth of the melt must be measured in a way that is simple, cost effective, accurate, non-contaminating, and capable of being connected in a feedback loop to the feeder.

Several methods for measuring the melt depth are known. For example, one method uses an oscillating probe consisting of a thin graphite rod, with the making or breaking of electrical continuity as the probe touches the molten silicon giving the vertical position of the melt surface. This requires an actuator mechanism, a position sensor, and a clear vertical access to the melt. This method, however, presents a problem because one implementation of the growth technique relies on precisely positioned insulating shields to shape the cooling profile of the ribbon. Allowing room for a mechanical linkage is an undesirable constraint in the design and placement of these insulating shields.

Another known method utilizes a laser beam which is reflected from the melt surface. This technique is used in metal foundry work for melt depth measurement. The problem with this method, however, is that providing a clear optical path to the melt surface hampers the design of insulating components. In addition, it is difficult to maintain clean viewing ports in an environment where vapor deposited silicon oxide is common.

A third method is more indirect and involves measuring the weight and size of the grown crystal to track the loss of silicon from the crucible. This technique is described in U.S. Pat. No. 4,936,947. A major disadvantage of this method, aside from its complexity, is that it is applicable for growth of discrete crystals in a batch mode and is less applicable for continuous growth.

The above described methods are inadequate in satisfying the necessary criteria for making cost-effective solar cell substrate material. It is therefore an object of the present invention to provide a method which does satisfy these criteria.

SUMMARY OF THE INVENTION

The present invention features an apparatus and method for providing improved precision in the measurement and regulation of the depth of the molten semiconductor pool (the "melt") in a continuous crystal growth process.

In one aspect, the invention features a method of continuous crystal growth. A crucible comprising a melt of a source material is provided, and an additional source material is continuously fed into the melt. To measure the depth, an input signal is passed through the crucible and the melt, and an output signal generated in response to the input signal is measured. The output signal relates to a depth of the melt. The depth of the melt is maintained at a substantially constant level by adjusting the rate of feeding the additional source material using the output signal. A crystalline ribbon is continuously grown by solidifying the melt at the solid-liquid interface. The source material can comprise a semiconductor material.

In one embodiment, to measure the depth of the melt, a current is passed through the crucible and the melt via a first pair of leads connected to the crucible, and a voltage generated in response to the current is measured via a second pair of leads connected to the crucible.

In another embodiment, the additional source material is continuously fed into the melt at a substantially constant rate. In still another embodiment, the depth of the melt is provided at a substantially constant level by maintaining the output signal to be substantially constant.

The invention also features a method of controlling a depth of a melt for crystal growth. An input signal is applied through a crucible and the melt disposed within the crucible, and an output signal generated in response to the input signal is measured. The output signal is related to the depth of the melt. An amount of a source material introduced into the melt is adjusted to maintain the depth at a substantially constant level using the output signal.

In one embodiment, to control the depth of the melt, a current is applied via a first pair of leads connected to the crucible, and a responsive voltage is measured via a second pair of leads positioned between the first pair of leads and connected to the crucible.

The invention further features a method of measuring the depth of a melt for crystal growth. An input signal is applied through a crucible and the melt disposed within the crucible, and an output signal generated in response to the input signal is measured. The output signal is related to the depth of the melt. In one embodiment, the response signal and the depth of the melt have a substantially linear relationship within an operating range.

In another aspect, the invention features a system for continuous crystal growth. The system includes a crucible comprising a melt of a source material, a power source electrically connected to the crucible through a first pair of leads, a feedback controller electrically connected to the crucible through a second pair of leads, and a feeder for continuously introducing the source material into the melt in response to the feedback controller. The source material can comprise a semiconductor material.

In one embodiment, the first pair of leads applies an input signal to the crucible and the melt, and the second pair of leads measures an output signal generated in response to the input signal. The input signal can comprise a current and the output signal can comprise a voltage.

In one detailed embodiment, the first pair and the second pair of leads are co-linear and attached to a bottom surface of the crucible. In another embodiment, the first pair of leads can be disposed on adjacent corners of the crucible and the second pair of the leads can be disposed on adjacent corners of the crucible.

The invention also features a system for measuring the depth of a melt for crystal growth. The system includes a crucible comprising a melt of a source material, a power source connected to the crucible through a first pair of leads for applying an input signal to the crucible and the melt, and a feedback controller in communication with the crucible through a second pair of leads attached to the crucible for measuring an output signal generated in response to the input signal. The output signal is related to the depth of the melt.

DETAILED DESCRIPTION

Figure 1:
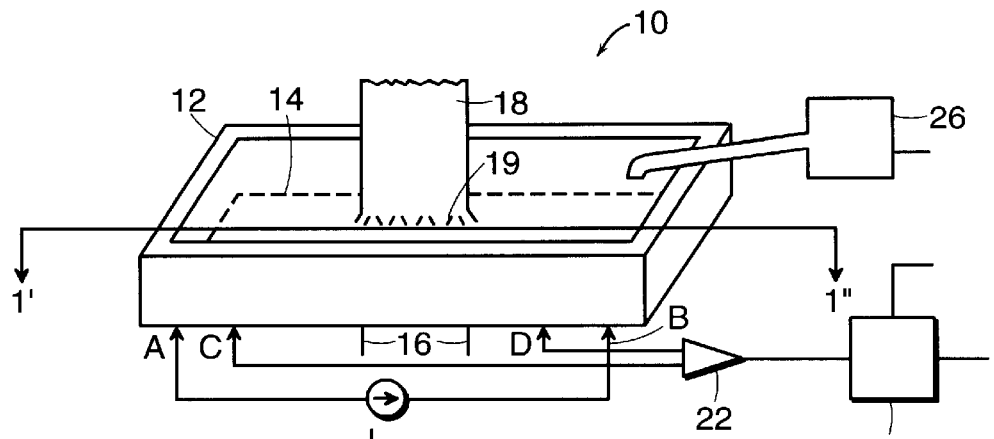
FIG. 1 is a schematic diagram of one embodiment of a continuous crystal growth system of the present invention.
Figure 2:
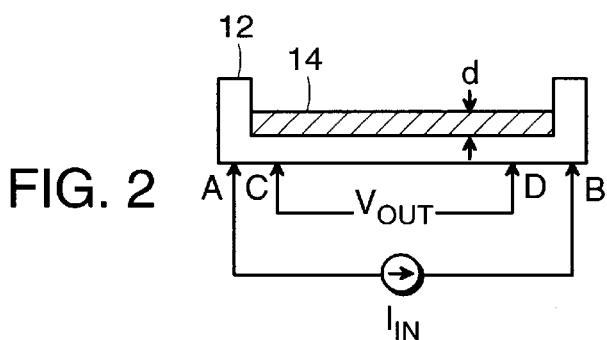
FIG. 2 is a cross-sectional view of the crystal growth system of FIG. 1 cut through line 1'–1" and showing only the crucible and the melt.

Referring to FIGS. 1 and 2, a continuous ribbon growth system 10 includes a crucible 12 containing a pool of molten silicon ("the melt") 14 and a pair of strings 16 extending through the crucible 12. A thin polycrystalline sheet of silicon 18 is slowly drawn from the melt 14 as the cooler liquid silicon crystallizes at the top of meniscus 19. The strings 16 passing through holes (not shown) in the bottom of the crucible 12 become incorporated in and define the edge boundaries of the crystalline sheet 18. The strings 16 stabilize the edges as the sheet 18 grows. The surface tension of the silicon prevents leaks through the holes of the crucible 12 where the strings 16 pass through. In the continuous-ribbon growth system 10, the melt 14 and the crucible 12 are housed within an inert-gas filled housing (not shown) to prevent oxidation of the molten silicon. Rollers (not shown) keep the sheet 18 moving vertically as the sheet 18 grows. The crucible 12 remains heated to keep the silicon molten in the melt 14.

The depth of the melt 14 is measured, and this information is provided to the feeder 26 to adjust the rate of introducing silicon into the melt 14 to keep the melt depth constant during the crystal growth. The feeder 26 adds silicon pellets to the melt 14 to compensate for the silicon lost from the melt 14 as the crystalline sheet 18 grows from the melt 14. The depth of the melt 14 is measured by passing an input signal through the crucible 12 and the melt 14, and by measuring an output signal generated in response to the input signal. The output signal indicates the depth of the melt.

In one embodiment, a current $I_{IN}$ is applied to the combination of the crucible 12 and the melt 14 through a pair of electrodes A and B, and a resultant potential is measured. The resultant potential $V_{OUT}$ is measured by a differential amplifier 22 through a pair of electrodes C and D, and provides a bulk resistance signal. The resultant potential is fed into the feedback circuitry 24, which generates a control signal for controlling the feed rate of the feeder 26. The feedback circuitry 24 is set up to maintain the resultant voltage at a constant level which corresponds to a desired melt height. In one embodiment, the pair of electrodes C and D are positioned between the pair of electrodes A and B.

The relationship between the melt depth and the measured output signal responsive to an input signal is described as follows. The present method of depth measurement utilizes unique properties of semiconductors and a commonly used crucible material (e.g., graphite). For example, at room temperature silicon is normally a semiconductor. However, at its melting point, like other semiconductors, silicon becomes a conductor of electricity almost as conductive as a metal. Graphite is also a conductor of electricity, although conductivity of the molten silicon is greater than that of graphite and therefore dominates when measured in parallel.

Figure 3:
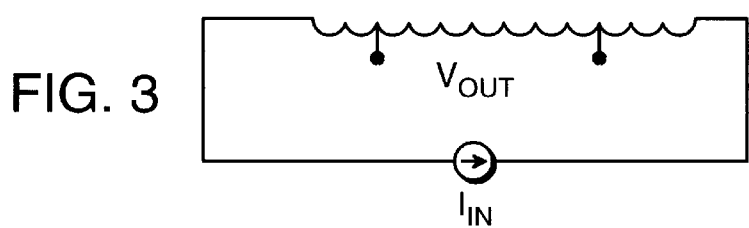
FIG. 3 is a circuit diagram illustrating the resistance of the crystal growth system of FIGS. 1 and 2.

The conductivity of the silicon melt is directly proportional to the cross-sectional area of the silicon melt. A change in the molten silicon melt depth changes the cross-sectional area of the silicon melt and consequently its conductivity, and conversely its resistance. When an electrical current is passed through both the crucible 12 and the melt 14, by making an electrical connection to two points (i.e., electrodes A and B) on the crucible 12, the melt 14 and the crucible 12 wall form a parallel resistive path. Thus, the electric potential developed in response to the applied current is affected by the depth of the melt 14 in the crucible 12. A voltage measurement taken across two points (i.e., electrodes C and D) on the crucible 12 provides a signal which is representative of the combined resistivity of the melt 14 and the graphite crucible 12, and thus represents the height (or depth) of the melt 14 in the crucible 12. The bulk resistivity of a typical graphite material used for the construction of semiconductor processing crucibles is about one milliohm-centimeter. The bulk resistivity of molten silicon is in the order of twenty (20) times less. Thus, if the area of the crucible section is significantly less than 20 times the area of the section of the typical melt (which is a typical case), then the molten silicon can be considered to be a "shorting layer" on top of a resistive layer of graphite. The measure then would preferably consider the resistance of the melt since the melt dominates the overall electrical conductance. FIG. 3 illustrates a circuit diagram of the continuous ribbon growth system 10 of FIGS. 1 and 2.

Figure 4:
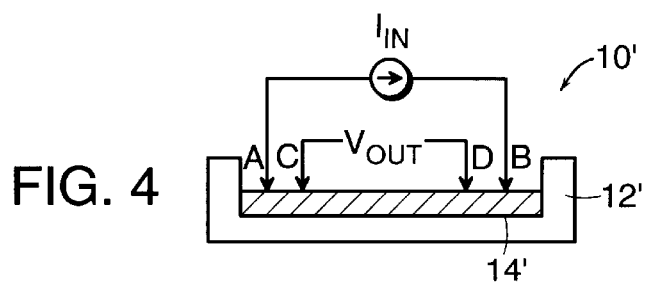
FIG. 4 is a cross-sectional view of another embodiment of a crystal growth system of the present invention.

Referring to FIG. 4, the continuous ribbon growth system 10' includes a crucible 12' containing a melt 14'. This figure shows another embodiment whereby the crucible 12' is constructed of an insulating material such as graphite, quartz, silicon carbide, or silicon nitride. In this embodiment, the depth of the melt 14' is measured by passing an input signal through the pair of electrodes A and B in direct contact with the melt 14' and by measuring a resulting output signal through the pair of electrodes C and D also in contact with the melt 14'. In one embodiment, the input signal is current and the output signal is voltage.

Figure 5:
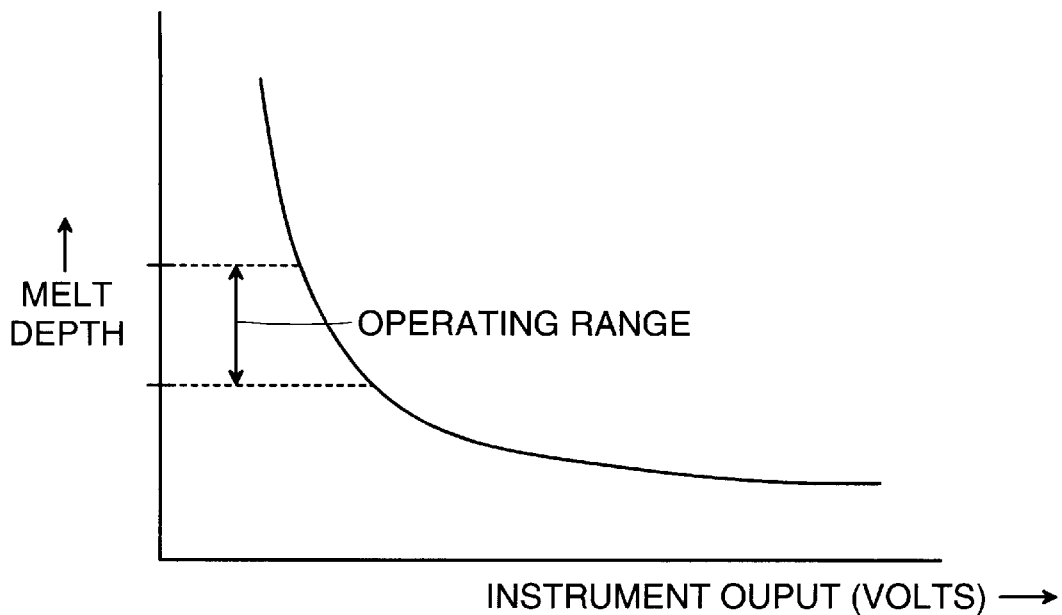
FIG. 5 is a graph illustrating the general relationship between the melt depth and the responsive output signal.
Figure 6:
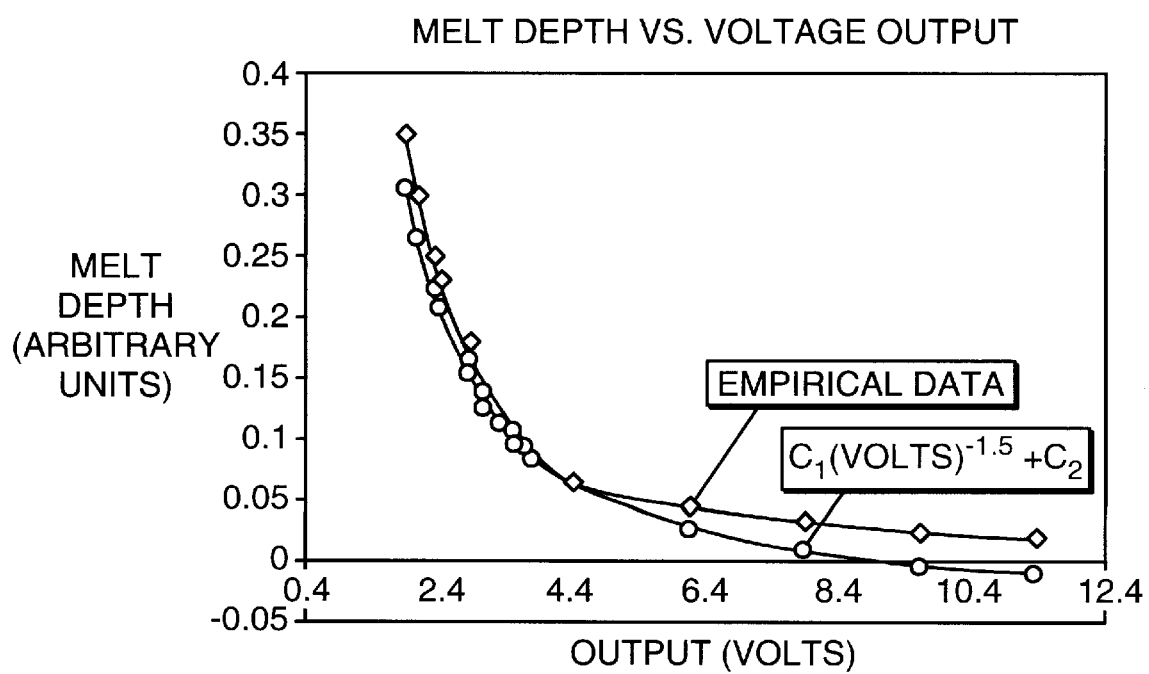
FIG. 6 is a graph comparing an empirical data and Programmable Logic Controller (PLC) model function of the relationship between the melt depth and the responsive output signal.

As shown in FIG. 5, the relationship between the measured output signal (i.e., voltage) and the depth of the melt 14 is not necessarily linear for the system of FIGS. 1–3. However, for small deviations from the operating point (of about 0.12 inches), a linear fit is adequate for control purposes, since the usual operating range is on a substantially linear portion of this curve. The nature of the non-linearity is dependent on the geometry, the conductivity of the graphite material of the crucible 12, and the positioning of the electrodes A, B on the crucible 12. In the embodiment of FIG. 4, where the crucible 12' is formed of an insulating material (e.g., quartz) and contact is made directly to the melt 14', the response signal would be linear. The non-linearity in the system of FIGS. 1–3 can, however, be accommodated and described by a simple equation which can be embedded in the software of a Programmable Logic Controller (PLC). A plot of the actual melt depth versus voltage output, as well as a simple equation (i.e., $C_1(volts)^{-1.5}+C_2$) that adequately describes the data is shown in FIG. 6. $C_1$ and $C_2$ are unique for a given configuration of probe spacing and operating point. In one embodiment, a representative value of $C_1$ is 0.068 and $C_2$ is determined in use. The use of this software is only needed when it is necessary to recover the melt depth from very large deviations from the nominal operating point. Because the system is designed to maintain the measured voltage at a predetermined value, however, the non-linearity is of little importance in most of the practical situations. Thus, the spatial-to-electrical transfer function may be approximated as linear around the operating point for purposes of designing speed and stability of the feedback loop.

Figure 7:
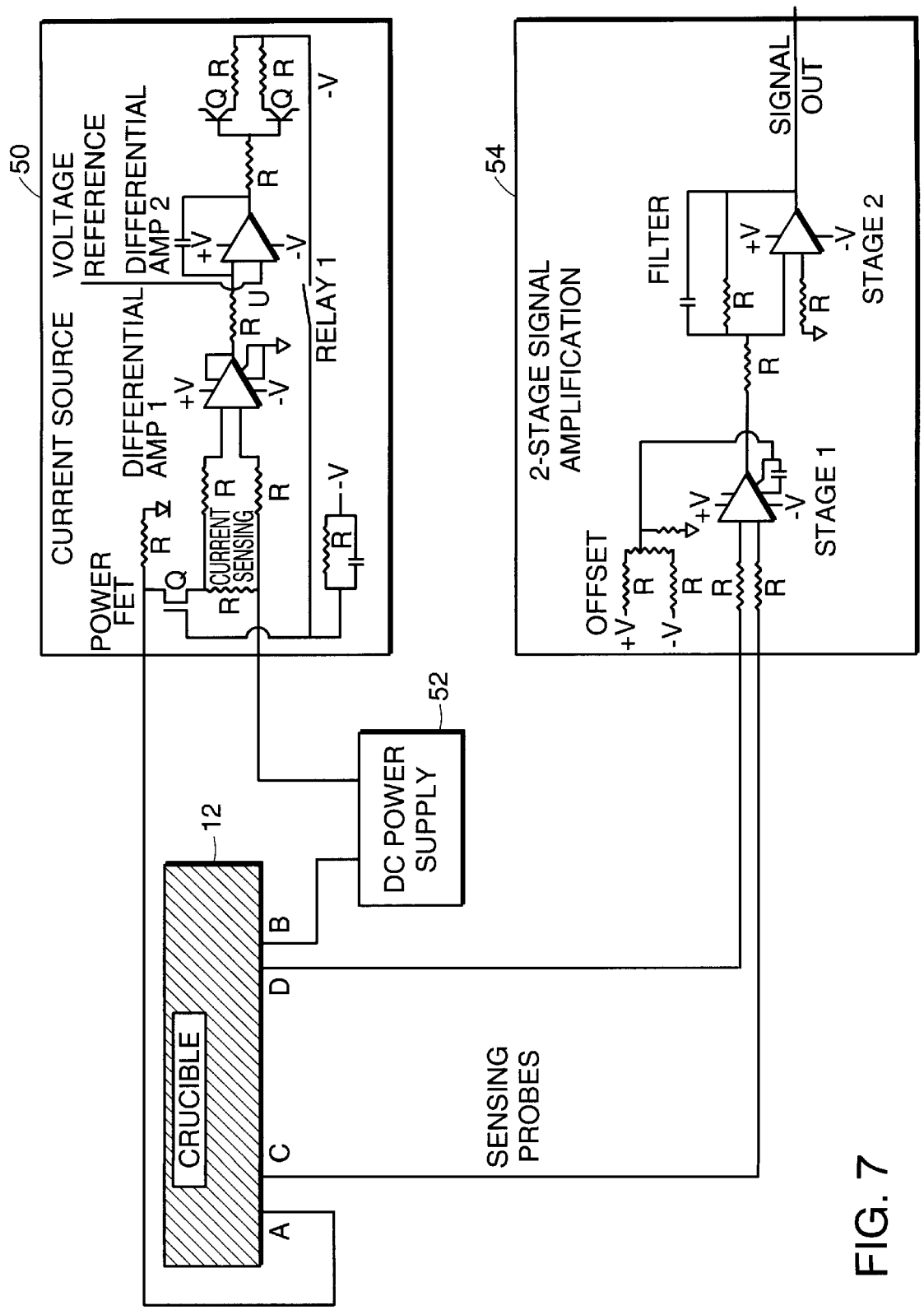
FIG. 7 is a circuit diagram of the current source and the amplification system of one embodiment of the crystal growth system of the present invention.

Referring to FIG. 7, the electrodes A and B apply a current to the crucible 12 and the electrodes C and D measure the voltage generated in response to the applied current. As shown, electrode A is connected to a current source 50, and electrode B is connected to a DC power supply 52. The power supply 52 and the current source 50 are also electrically connected to each other, and together apply current to the crucible 12. The current source 50 limits current flow to the crucible 12 to a valve (e.g., less than 2 Amps). Current is sensed by a 56 mΩ sensing resistor, the voltage drop across it is input to a differential amplifier. Voltage output from the amplifier is compared to a reference voltage. The voltage output goes to a push-pull transistor pair which controls the gate of the power FET and serves to control current through the FET. The output signals generated in response to the input signals are sensed by sensing probes C and D, and are transmitted to an amplifier of a two-stage signal amplification circuitry 54. The responsive output signal is in the 1 μV range. The output signal is filtered and amplified to produce an output signal of about 1 V.

In one embodiment, the resistance measurement of the crucible silicon melt combination is made in a four-wire fashion, where the current is passed through the crucible/silicon melt combination by connecting to a first pair of contact points A, B on the crucible 12, and the voltage is measured at a second pair of contact points C, D on the crucible 12 as shown in FIGS. 1 and 2. When the resistance measurement is made in a four-wire fashion, the spatial placement of the four contacts relative to each other is not critical, so contacts may be placed according to mechanical or thermal convenience. For instance, the four contacts could be co-linear along the bottom of the crucible, or they could be arranged as in a Van der Pauw type resistivity measurement, where the current is impressed across two adjacent corners of the crucible, and the voltage is measured across the other two adjacent corners. When practical, it is desirable to arrange the contacts spatially to provide the highest signal-to-noise ratio in making the relevant measurements. Absolute signal level and sensitivity of signal level to change in melt height are important.

Initial implementations of the invention using mechanically convenient, non-ideal (from a signal-to-noise ratio standpoint) placement of the electrodes allowed an adequate signal-to-noise ratio to regulate the melt height to within plus or minus 2.5 mils, using an input current of 2 Amps.

One embodiment of the invention uses a pulsed DC measurement to eliminate the effects of DC offset drift on the measurement. Another embodiment utilizes modulation of the current and synchronous detection of the voltage signal, at a frequency selected to avoid harmonics of 60 Hz. Another embodiment utilizes a modulated current and a narrow bandpass filter to monitor the voltage signal. The effects of temperature variation on the resistance measured can be compensated for if the temperature of the melt and crucible are monitored. Separate tight regulation of the temperature of the melt and crucible are needed for the growth process and make compensating the resistance measurement unnecessary.

Figure 8:
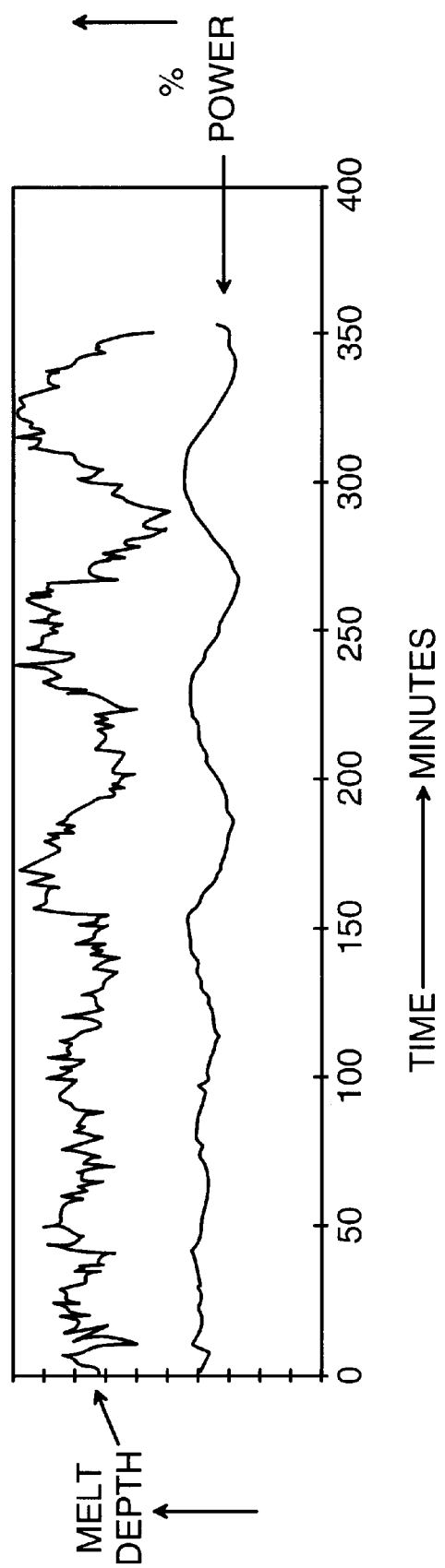
FIG. 8 is a graph illustrating the relationship between the melt depth and the feeder power over time.

The depth of the melt measured according to the present invention is used to control the rate of feeding the silicon source material into the crucible, and thereby maintains the depth of the melt at a constant to achieve controlled uniform crystal growth. Referring to FIG. 8, the feeder power which controls the rate of introducing the source material responds to the melt depth measurement over time.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method of continuous crystal growth comprising the steps of:
   a) providing a crucible comprising a melt of a source material;
   b) continuously feeding an additional source material into the melt;
   c) passing an input signal through the melt;
   d) measuring an output signal generated in response to the input signal, the output signal relating to a depth of the melt;
   e) maintaining the depth of the melt at a substantially constant level by adjusting a rate of feeding the additional source material using the output signal; and
   f) continuously growing a crystalline ribbon by solidifying the melt.

2. The method of claim 1 wherein step c) comprises passing an input signal through the crucible and the melt.

3. The method of claim 2 wherein step b) comprises continuously feeding the additional source material into the melt at a substantially constant rate.

4. The method of claim 2 wherein step c) comprises passing a current through the crucible and the melt via a first pair of leads connected to the crucible.

5. The method of claim 4 wherein step d) comprises measuring a voltage generated in response to the current via a second pair of leads connected to the crucible.

6. The method of claim 1 wherein step e) comprises providing the depth of the melt at a substantially constant level by maintaining the output signal to be substantially constant.

7. The method of claim 1 wherein the source material comprises a semiconductor material.

8. A method of controlling a depth of a melt for crystal growth comprising the steps of:
    a) applying an input signal through a melt disposed within a crucible;
    b) measuring an output signal generated in response to the input signal, the output signal relating to the depth of the melt; and
    c) adjusting an amount of a source material introduced into the melt to maintain the depth at a substantially constant level using the output signal.

9. The method of claim 8 wherein step a) comprises applying an input signal through a crucible and the melt disposed within the crucible.

10. The method of claim 9 wherein step a) comprises applying a current via a first pair of leads connected to the crucible, and step b) comprises measuring a voltage via a second pair of leads connected to the crucible.

11. A method of measuring the depth of a melt for crystal growth comprising the steps of:
    a) applying an input signal through a crucible and the melt disposed within the crucible; and
    b) measuring an output signal generated in response to the input signal, the output signal relating to the depth of the melt.

12. The method of claim 11 wherein the response signal and the depth of the melt has a substantially linear relationship within an operating range.

13. A system for continuous crystal growth comprising:
    a crucible comprising a melt of a source material;
    a power source electrically connected to one of the crucible or the melt through a first pair of leads;
    a feedback controller electrically connected to one of the crucible or the melt through a second pair of leads; and
    a feeder for continuously introducing the source material into the melt in response to the feedback controller.

14. The system of claim 13 wherein the source material comprises a semiconductor material.

15. The system of claim 13 wherein the first pair of leads applies an input signal to the crucible and the melt, and the second pair of leads measures an output signal generated in response to the input signal.

16. The system of claim 15 wherein the input signal comprises a current and the output signal comprises a voltage.

17. The system of claim 13 wherein the first pair and the second pair of leads are co-linear and attached to a bottom surface of the crucible.

18. The system of claim 13 wherein the first pair of leads are disposed on adjacent corners of the crucible and the second pair of the leads are disposed on adjacent corners of the crucible.

19. The system of claim 13 wherein the power source comprises a DC power supply and a current source.

20. The system of claim 13 wherein the crucible comprises one of graphite, quartz, silicon carbide, or silicon nitride.

21. A system for measuring the depth of a melt for crystal growth comprising:
    a crucible comprising a melt of a source material;
    a power source connected to one of the crucible or the melt through a first pair of leads for applying an input signal to the crucible and the melt;
    a feedback controller in communication with the crucible through a second pair of leads attached to the crucible for measuring an output signal generated in response to the input signal, the output signal relating to the depth of the melt.

* * * * *